United States Patent
Gordon et al.

(10) Patent No.: US 6,359,283 B1
(45) Date of Patent: Mar. 19, 2002

(54) NOISE REDUCED PHOTON DETECTOR

(75) Inventors: Neil T. Gordon; Anthony M. White; Charles T. Elliott, all of Malvern (GB)

(73) Assignee: The Secretary of State for Defence, Farnborough (GB)

(*) Notice: Subject to any disclaimer, the term of this patent is extended or adjusted under 35 U.S.C. 154(b) by 0 days.

(21) Appl. No.: 09/451,111

(22) Filed: Nov. 30, 1999

(30) Foreign Application Priority Data

Sep. 17, 1999 (GB) .............................................. 9921888

(51) Int. Cl.⁷ ................................................ G01T 1/24
(52) U.S. Cl. .............................. 250/370.13; 250/370.08
(58) Field of Search .................... 250/370.08, 370.13; 257/432, 436, 428

(56) References Cited

U.S. PATENT DOCUMENTS

| | | | | |
|---|---|---|---|---|
| 3,963,926 A | * | 6/1976 | Borello | 250/338.1 |
| 5,583,340 A | * | 12/1996 | Grossman | 250/353 |
| 5,981,950 A | * | 11/1999 | Wolny et al. | 250/338.4 |
| 6,046,485 A | * | 4/2000 | Cole et al. | 257/428 |
| 6,081,019 A | * | 6/2000 | White | 257/448 |
| 6,091,069 A | * | 7/2000 | Ashley et al. | 250/352 |

OTHER PUBLICATIONS

P. Berdahl, Radiant refrigeration by semiconductor diodes, Aug. 1985, J. Appl. Phys. 58(3), 1369–1374.*

* cited by examiner

Primary Examiner—Constantine Hannaher
Assistant Examiner—Shun Lee
(74) Attorney, Agent, or Firm—Nixon & Vanderhye P.C.

(57) ABSTRACT

A noise reduced photon detector incorporates an array (10) of semiconductor diode detector elements (12). Each element (12) has an extrinsic active layer (20) sandwiched between two layers (18, 22) of wider bandgap and mutually opposite conductivity type. These layers are in turn sandwiched between two further layers (16, 24) of wider bandgap than the active layer (20) and of higher doping than the other layers (18, 22). A mirror (34) extends round much the array (10) and isolates each element (12) from photons emitted by other elements (12). In operation the elements (12) are reverse biased and exhibit negative luminescence which reduces their photon emission. These two effects reduce unwanted photon generation and absorption, and consequently photon noise is also reduced.

13 Claims, 4 Drawing Sheets

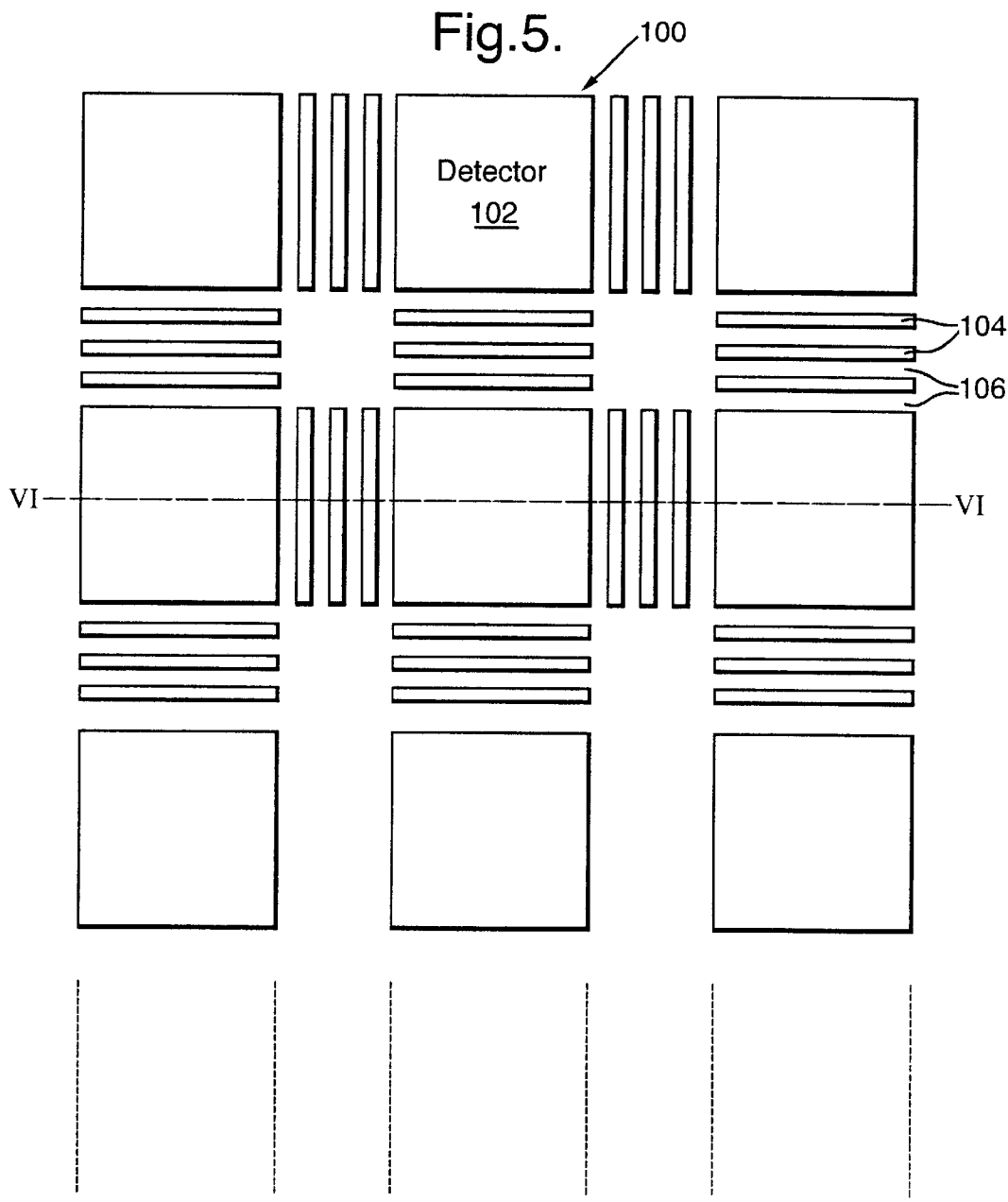
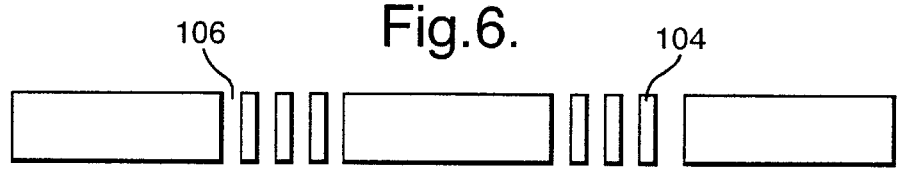

NOISE REDUCED PHOTON DETECTOR

BACKGROUND OF THE INVENTION

1. Field of the Invention

This invention relates to a noise reduced photon detector, and in particular (but not exclusively) to an infrared detector.

2. Discussion of Prior Art

Infrared detectors of semiconductor material such as cadmium mercury telluride (CMT) are well known. Conventional types are normally cooled to below 200K or 80K for operation at a radiation wavelength in the 3–5 µm band or the 8–12 µm band respectively. Cooling is needed to provide for the detector's semiconductor material to be in an extrinsic regime, ie to reduce the intrinsic contribution to conduction, to increase sensitivity and reduce Auger-generated noise. Broadly speaking, there are three important conduction regimes for a semiconductor: unsaturated extrinsic, saturated extrinsic and intrinsic, which occur at low, moderate and high temperature respectively. Unsaturated extrinsic conduction is due to one type of carrier activated from impurities, not all of which are ionised. The saturated equivalent is similar except that all impurities are ionised. In the intrinsic regime, conduction has a substantial contribution from valence band to conduction band transitions producing both types of carrier, ie electron-hole pairs. There is an intervening transition region between the second and third regimes where conduction is a combination of extrinsic and intrinsic.

More recently, as set out in U.S. Pat. No. 5,016,073, it has proved possible to reduce the intrinsic contribution to conduction in a semiconductor detector by designing it to employ the phenomena of exclusion and/or extraction to reduce the carrier concentration. An excluding contact allows majority carriers to flow in one direction but inhibits the reverse flow of minority carriers. An extracting contact removes minority carriers which diffuse to it. In consequence, a semiconductor region between two such contacts becomes depleted of minority carriers when electrically biased, and charge neutrality considerations dictate that the majority carrier concentration fall to the same extent. The combination of these two effects is to reduce the intrinsic contribution to conduction, simulating the effect produced by cooling and allowing detector operation at higher temperatures either uncooled or with a reduction in cooling requirements.

SUMMARY OF THE INVENTION

It is an object of this invention to provide a detector with improved noise characteristics.

The present invention provides a noise-reduced photon detector including an array of detector elements characterised in that it includes at least one of the following:

(a) isolating means for isolating each element from photons emitted from other elements and other regions of the detector, (b) the elements being arranged to exhibit negative luminescence and thereby reduced photon emission, and (c) a structure arranged to exhibit negative luminescence and to absorb photons which would otherwise propagate to detector elements and give rise to photon noise.

It has been found that, in detectors operated at ambient or near ambient temperatures and arranged to suppress Auger-generated noise, radiative noise becomes important, and the invention provides the advantage of reducing it.

In a preferred embodiment, a detector of the invention preferably includes both isolating means for isolating each element from photons emitted by other elements and detector elements arranged to exhibit negative luminescence and thereby reduced photon emission.

Each detector element may comprise an extrinsic active region. Alternatively, each active region may exhibit intrinsic conductivity when unbiased. Each active region may be sandwiched between two regions of wider bandgap arranged to reduce its minority carrier concentration. The wider bandgap regions may be of opposite conductivity type to one another. The active region and wider bandgap regions may in turn be sandwiched between two further regions of wider bandgap than the active region and of higher doping than the other regions.

Each detector element may be a semiconductor diode arranged to exhibit at least one of carrier exclusion and extraction under reverse bias to reduce an intrinsic contribution to carrier concentration in an active element region.

The isolating means may incorporate a mirror arranged to reflect away from detector elements photons not received directly from an scene imaged thereon. It may incorporate a cold shield arranged to screen the detector elements from unwanted radiation, or alternatively internally tapering reflectors such as Winston cones arranged to concentrate radiation from an observed scene upon respective detector elements and to screen them as aforesaid. Alternatively, a photonic bandgap structure may be arranged to restrict unwanted photon propagation between detector elements.

BRIEF DESCRIPTION OF THE DRAWINGS

In order that the invention might be more fully understood, an embodiment thereof will now be described, by way of example only, with reference to the accompanying drawings, in which:

FIG. 5 is a plan view of a detector element array incorporating ridge/slot photonic band gap structures between adjacent elements;

FIG. 6 is a sectional view on lines VI—VI in FIG. 5; and

DETAILED DISCUSSION OF PREFERRED EMBODIMENTS

Figure 1:
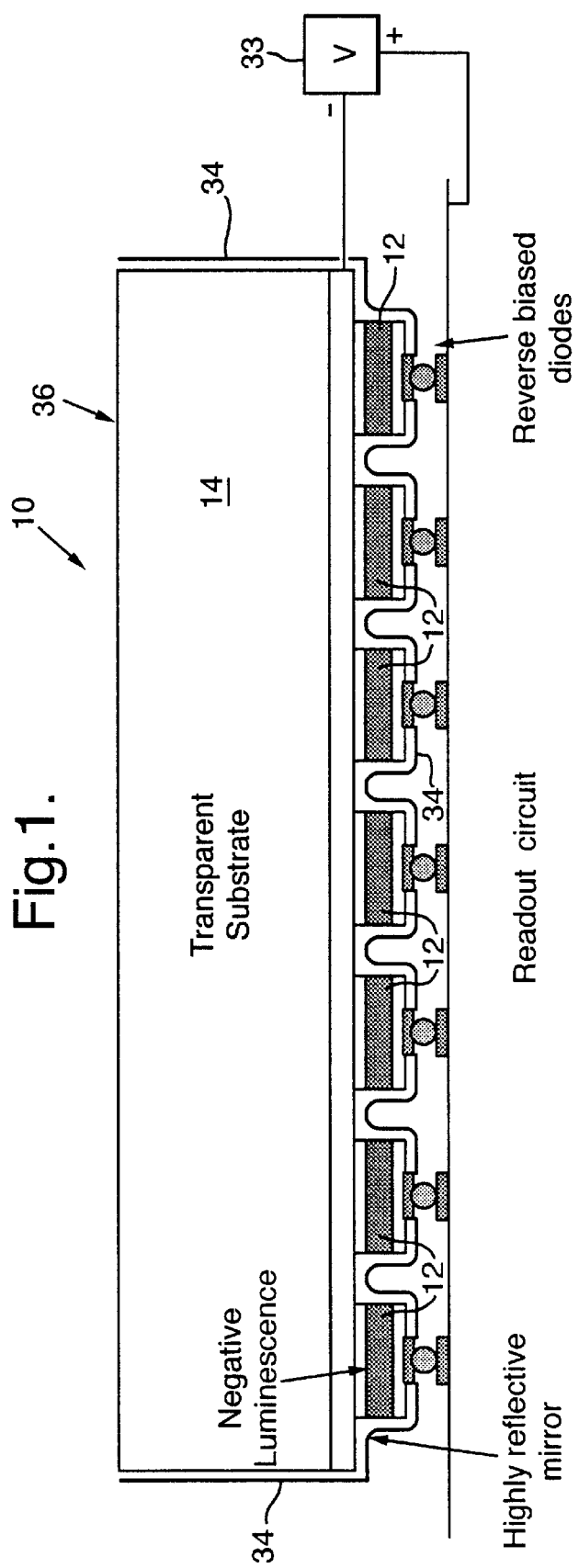
FIG. 1 is a schematic drawing of a semiconductor detector array of the invention shown in vertical section; it is not drawn to scale.
Figure 2:
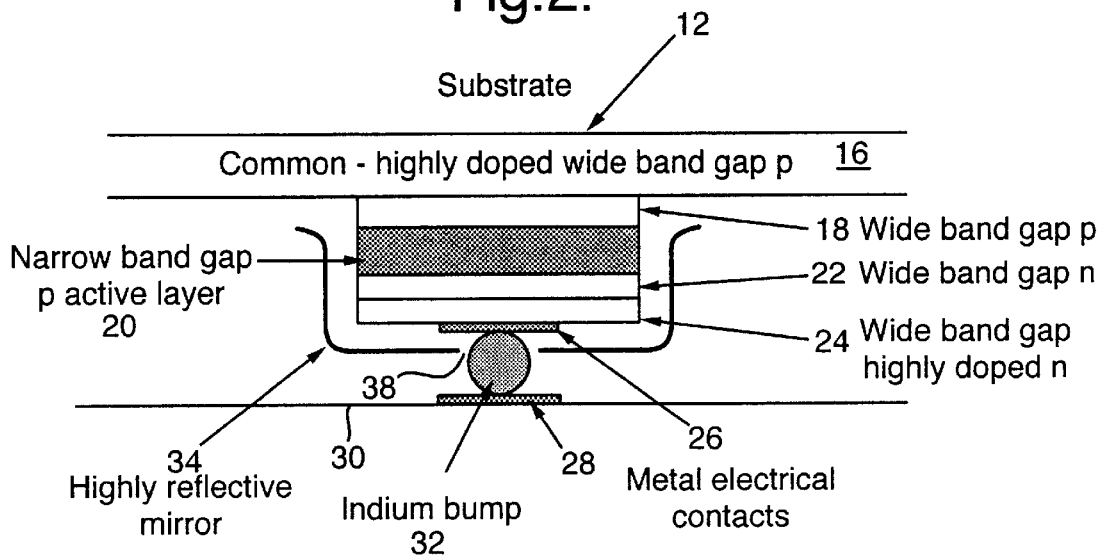
FIG. 2 illustrates a detector of the FIG. 1 array in more detail and relatively enlarged but not drawn to scale.

Referring to FIG. 1, a semiconductor detector array of the invention indicated generally by 10 is intended for operation in the 3–5 µm infrared wavelength band. A vertical section of one row of a two dimensional array is shown schematically with seven detector elements 12, although a practical array would be a larger, and would be a one or two dimensional array of such elements. Referring now also to FIG. 2, the detector elements 12 have a common GaAs substrate 14 retaining five layers 16 to 24 each of which is the ternary $Cd_xHg_{1-x}Te$ material system.

The layers 16 to 24 include a relatively narrow band gap p-type active layer 20 which in this embodiment is sufficiently doped to be extrinsic at the detector array operating temperature (ambient temperature in this instance). The active layer 20 is sandwiched between relatively wide band gap layers 18 and 22 doped p-type and n-type respectively with relatively low dopant concentrations. The doping is reduced in the layers 18 and 22 immediately adjacent the active layer 20 to prevent carriers diffusing into it. These three layers 18 to 22 are in turn sandwiched between wide band gap highly doped layers 16 and 24 (the latter shown in FIG. 2 only). The layer 16 is common to all detector elements 12 but each of the latter has an individual separate part of each of the other layers 18 to 24.

The table below gives the thickness, $Cd_xHg_{1-x}Te$ composition parameter x and dopant type and concentration of the layers 16 to 24,which collectively form a $p^+ppnn^+$ structure. Here the presence and absence of underlining indicates relatively larger and relatively smaller band gap respectively, and the presence and absence of the superscript "+" indicates relatively high and relatively low doping respectively.

| Layer | Thickness ($\mu$m) | Composition Parameter x | Dopant type (p or n) | Dopant Concentration ($\times 10^{15}$ cm$^{-3}$) |
|---|---|---|---|---|
| High Doping Wide Gap 16 | 6.6 | 0.48 | p$^+$ | 300 |
| Low Doping Wide Gap 18 | 2 | 0.48 | p | 10.0 |
| Active Layer 20 Low Doping Narrow Gap | 2.5 | 0.32 | p | 2.50 |
| Wide Gap 22 Low Doping | 1 | 0.37 | n | 1.00 |
| High Doping, Fairly Wide Gap 24 | 1.5 | 0.45 | n$^+$ | 400 |

Each element 12 has a metal contact 26 adjoining the lowermost layer 24,another contact being provided by the common layer 16. Each contact 26 is connected to a contact 28 on an external circuit 30 by an indium solder bump 32. A bias voltage source indicated schematically by 33 is connected between the common layer 16 and the circuit 30, and in operation it biases the layer 16 negative relative to the contacts 26. A highly reflecting mirror 34 extends between detector elements 12 and around all outer surface regions of the array 10 except for an uppermost radiation receiving surface 36 and holes such as 38 through which the indium solder bumps 32 extend. The mirror is deposited on a thin insulating layer (not shown). In structures containing a mirror, care needs to be taken to minimise cross talk between the elements. This is achieved by making the active layer 20 sufficiently thick to absorb most of the radiation incident on it.

The array 10 operates as follows. The common layer 16 is negatively biased with respect to the contacts 26 and 28,This reverse biases a pn heterojunction diode which exists between each p-type active layer 20 and the adjoining n-type wide band gap layer 22 which is immediately below it.

It has been found that, at the relatively high operating temperatures of the detector array 10, photon noise is an important source of noise. It arises from random interchange of photons between detector elements 12 and photon receipt by such elements from their surroundings. It is caused by random fluctuations in the rate of reception of these photons, which obey Bose Einstein statistics.

Radiation exchange between the array 10 and its surroundings is greatly reduced by the mirror 34,which reflects away from the elements 12 photons which they do not receive directly from a remote scene (not shown) imaged on to the array by imaging system optics (not shown) used with the array. The holes 38 and the insulating layer supporting the mirror 34 prevent the latter short circuiting the junction between layers 20 and 22.

With the exception of the active layers 20 of the detector elements 12 which absorb and detect incident infrared radiation, the array 10 is transparent, ignoring the mirror 34, electrical contacts 26/28 and indium bumps 32. This is because the substrate 14 and layers 16, 18, 22 and 24 are composed of material of larger band gap than the active layer 20. For example, the active layer may be $Hg_{1-x}Cd_xTe$ with a band gap of 0.3 eV suitable for detection in the 3–5 $\mu$m radiation wavelength band. The substrate 14 is GaAs, but it could alternatively be CdZnTe, sapphire or Si as these also have bandgaps greater than 1.0 eV making them transparent to 3–5 $\mu$m wavelength radiation. It is also advantageous to keep the substrate 14 as thin as possible.

In operation, each detector element 12 is reverse biased so that its active layer 20 is a net absorber of radiation compared to its surroundings; ie it exhibits negative luminescence. Negative luminescence is known. It relates to emission of less radiation than a thermal equilibrium background level, and is described by Bolgov et al, in Semiconductors 27(1), January 1993. It is also described by Berdahl et al, Infiared Physics Vol 29, No 2–4, pp 667–672, 1989. The negative luminescence characteristic ensures that emission from one detector element 12 to another is inhibited and fewer photons are available to contribute to photon noise.

The total photon generation rate in the array 10 is required to be less than the rate at which photons are absorbed in the active layers 20. This is to ensure that the photon density inside the array 10 is below the level at thermal equilibrium, which reduces noise associated with random exchange of photons between pairs detector elements 12.

The total photon generation rate $G_{total}$ in the array 10 can be calculated by summing contributions from its various regions:

$$G_{total} = \sum_i G_i V_i \qquad (1)$$

where $G_i$ is the generation rate per unit volume in an ith region, such regions comprising the layers 16 to 24 and any and all other regions of the (e.g. the substrate 14) array which might provide a photon flux. $V_i$ is the ith region volume. In addition, if the mirror 34 is not 100% reflective, photon generation from it also has to be added as a further term in Equation (1). The photon generation rate $G_i$ can be calculated from the ith region's absorption coefficient, $\alpha(\epsilon)$.

$$G_i = n_i^2 \int_{E_{det}}^{\infty} D_{ph}(\varepsilon)\alpha(\varepsilon) c\, d\varepsilon \qquad (2)$$

where $\epsilon$ is photon energy, $D_{ph}(\epsilon)$ is the equilibrium photon density in free space, $n_i$ is the ith region's refractive index, and c is the velocity of light.

The maximum rate $R_j$ at which photons can be removed by negative luminescence of one of the detector elements 12 (element index number j) is:

$$R_j = \eta_{qu} \text{Flux}(E_g, T) n^2 \text{Area}_j \qquad (3)$$

where $\eta_{qu}$ is the quantum efficiency of the active layers 20, Flux($E_g$, T) is the thermal equilibrium photon flux received by the element 12 from the $2\pi$ solid angle above it for photon energies above the band gap $E_g$, n is refractive index of layer 18 next to the active layer 20 and Area$_j$ is the photon-receiving surface area of the jth element.

For an $Hg_{1-x}C_xTe$ element with a band gap of 0.3 eV and $\eta_{qu}$ of 70%, the maximum photon removal rate at room temperature is $3.0 \times 10^{16}$ photons $cm^{-2}$ $s^{-1}$. To reduce the mean photon density in the detector 10 to below its thermal equilibrium level Equations (1), (2) and (3) can be combined to give the condition:

$$\sum_j R_j > \sum_i G_i V_i \qquad (4)$$

To achieve this, layers 16, 18, 22 and 24, ie layers other than the active layer 20, should also have as low an average absorption coefficient as possible. The mirror 34 should be as highly reflecting as possible and extend over all of the array 10 except for the radiation receiving surface 36. It must be electrically isolated from the output contacts 26 and 28, and an insulating layer is used for this purpose.

To achieve background limited operation at room temperature, the detector elements 12 need to reduce their photon emission by at least a factor of $n^2$. This requires a bias greater than $kT/q \log(n^2)$ where k is Boltzmann's constant, T is absolute temperature, q is the charge on the electron and n is an actual or effective value for detector component refractive index: in a structure in which the substrate 14 and layers 16 to 24 have the same refractive index, it is that refractive index, but if these have differing refractive indices it is a effective value calculated to take account of differences or an approximation thereto if the indices are similar. For CdHgTe layers on a GaAs substrate, refractive index differences are small and can be ignored as one is merely calculating a criterion for setting the bias voltage, which should have a value greater than 70 mV for CdHgTe with n=3.8 and T=295.

The substrate 14 should have an anti-reflection coating upon its top surface 36. It would preferably have a refractive index sufficiently low to produce significant total internal reflection at its interface with the common layer 16. Sapphire substrates have been used successfully for the 3–5 $\mu$m band and they have a refractive index of 1.7 compared with 3.3 for GaAs. Using a sapphire substrate 14 would give total internal reflection back to layer 16 for angles of incidence greater than 30 degrees; i.e. optical coupling of photons between pairs of detector elements 12 would only be possible for angles of incidence less than 30 degrees The example of the invention described with reference to FIGS. 1 and 2 reduces radiative noise with a combination of the two techniques of negative luminescence and optically isolating the detectors from each other as much as possible. Optically isolating the detectors has the advantage that it applies to any detector element bias polarity. In some applications it might not be necessary to use both these techniques.

As a result of advances in the technology of uncooled or minimally-cooled infrared detectors, in particular the use of Auger suppression techniques to reduce leakage currents, residual currents approach radiative limits and further reductions in the leakage currents will require the devices to be cold shielded. Low temperature or cryogenically-cooled detectors commonly employ a cold shield to limit the field of view of the detector to a scene to be observed and exclude room temperature background radiation. It has been found surprisingly that this is also beneficial for uncooled or minimally-cooled infrared detectors despite their being at or near the same temperature as the background.

Figure 3:
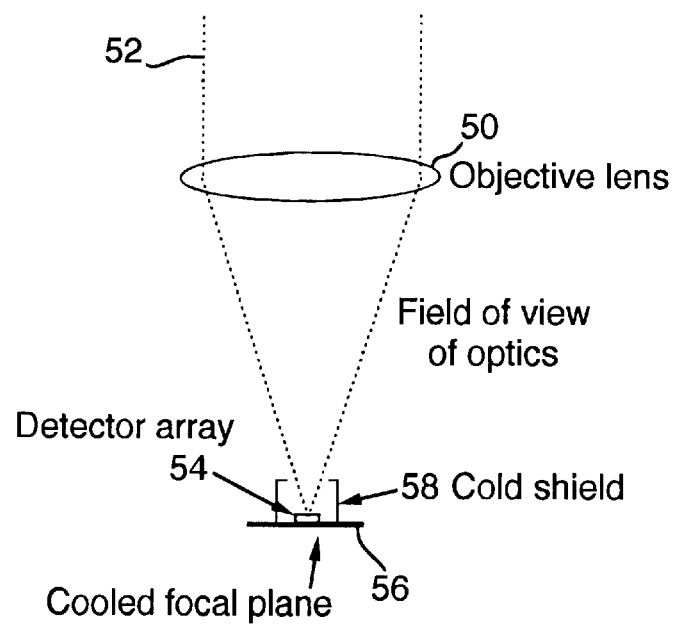
FIG. 3 depicts use of a cold shield in a detector device.

Referring to FIG. 3, an objective lens 50 brings parallel light 52 from a remote scene (not shown) to a focus on a cryogenically cooled detector array 54 in a focal plane 56. A cold shield 58 partially covers the detector array 54 and restricts radiation incident on it largely or wholly to that received from the scene via the lens 50. The cold shield 58 prevents radiation from reaching the detector array 54 from outside its field of view through the lens.

For an uncooled detector, a similar scheme could be used and would require a cooling system for the cold shield. To avoid the need for cooling the cold shield would be arranged to provide negative luminescence simulating emission characteristics of a cold surface.

Alternatively, optical concentrators may be employed so that detector elements are only exposed to radiation from the field of view of an imager in which they are incorporated. Compound parabolic concentrators or Winston cones may be used, the latter being disclosed in "The Optics of Non-imaging Concentrators—Light and Solar Energy", W. T. Welford and R. Winston, Academic Press, London 1978. Optical concentrators can re-direct radiation within an imager with a cone angle $\theta_{optic}$ (related to the f/number of the imager optics) over a circular area of diameter $d_{input}$ on to the detector with diameter $d_{det}$ within a cone angle $\theta_{det}$ where:

$$n_{det} d_{det} \sin(\theta_{det}) = d_{input} \sin(\theta_{optics})$$

and $n_{det}$ is the refractive index of the detector material. For example, if the detector angle is set to 90° (so that the complete field of view of the detector is covered), $\theta_{optics}$ is taken as 45° for a f/0.5 system and $n_{det}$ is taken as 4—then $$\frac{d_{input}}{d_{det}} = 5.66$$

Figure 4:
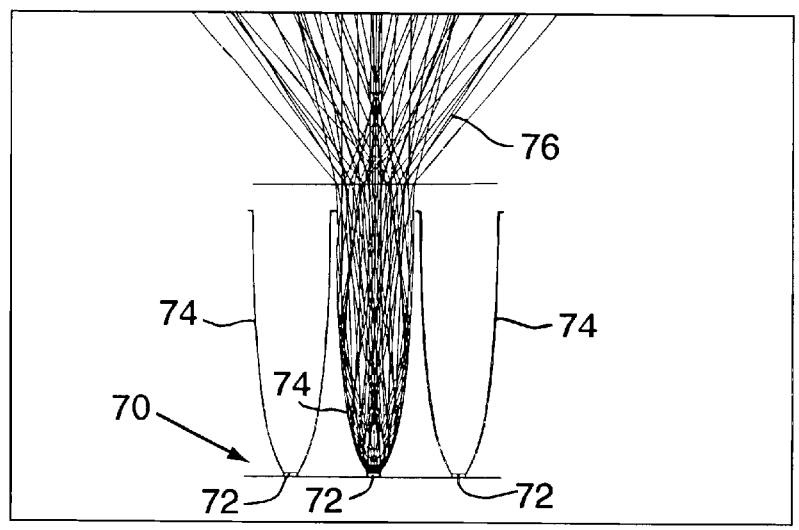
FIG. 4 illustrates use of Winston cones in a detector device.

Referring now to FIG. 4, an array 70 of three detector elements 72 is shown each having a respective Winston cone 74. Radiation indicated by rays 76 is focused by an imager (not shown) on to tops of the cones 74, which are designed so that all the radiation incident within the imager f/number is redirected onto detector elements 72. Radiation incident at higher angles will largely be reflected out of the system. Although Wilson cones are particularly efficient, other internally reflecting devices with internal cross-sections tapering down to respective detector elements would also be suitable To make the cones 74 work as a cold shield in a practical situation, a number of additional conditions need to be addressed. The absorption coefficient within the cone material needs to be sufficiently small so that thermal radiation generated within the material and incident on the detector is small compared to background flux. Cone surfaces should be highly reflecting so that radiation outside a cone 74 is not redirected on to the detector array 70 through these surfaces and also to minimise thermal radiation generation at them. This could be achieved in practice by depositing a metal film on the outside of the structure. The detector array 70 also requires a reflecting film upon its underside.

The example described with reference to FIG. 4 has the additional advantage that radiation from a scene is concentrated on to a smaller area and hence detector area is reduced (in this example by a factor of 32). Bulk non-radiative currents are therefore also reduced by a factor of 32.

For a detector at room temperature in thermal equilibrium with its surroundings, it would appear at first sight that cold shielding is not possible. However, analysis shows that the total amount of radiation absorbed by the detector is unchanged by the presence of the concentrator—which only serves to redirect the radiation into a smaller cone angle over a larger area.

As described earlier each detector element 12 incorporates an active layer 20 which is sufficiently doped to be extrinsic at the required operating temperature. The active layer 20 may alternatively be sufficiently weakly doped to be intrinsic at the operating temperature (eg ambient temperature). The heterojunction between each active layer 20 and adjoining wider band gap layer 18 above it then provides an excluding contact to the former. Moreover, a heterojunction diode would exist between each active layer 20 and the adjoining wider band gap layer 22 immediately below it, and provides an extracting contact to it. The excluding contact would allow holes (majority carriers) flow freely from layer 18 to active layer 20 but it would inhibit electron (minority carrier) flow in the reverse direction. An extracting contact removes minority carriers which diffuse to it, and these cannot be replenished from an excluding contact. In consequence, the minority carrier concentration in the active layer 20 would fall under reverse bias, and charge neutrality considerations dictate that the majority carrier (hole) concentration would fall with it. These two effects would reduce the intrinsic contribution to conduction in the active layer 20. In the absence of bias, the active layer 20 would be at the array operating temperature (conductivity predominantly due to electron-hole pairs). Under bias, carrier concentrations would fall in the active layer 20 sufficiently to render it extrinsic (conductivity predominantly due to one carrier type from ionised impurities).

In another embodiment of the invention, a photonic band gap structure is used to reduce radiative coupling between adjacent detector elements in an array. Photonic band gap structures in materials are known, and have the property that photons with energies in one or more bands cannot propagate in a material so structured; ie by analogy with forbidden energy bands for electrons in semiconductors there are "forbidden" energy bands for photons at wavelengths for which the material is reflecting. A photonic band gap is produced in a composite material in which refractive index alternates in value on a scale comparable with the wavelength of the relevant photons.

Referring to FIGS. 5 and 6, a detector array 100 is shown in plan and section respectively, and has individual detector elements 102 separated by ridges such as 104 of insulating material and intervening air-filled slots such as 106. The slots 106 are shown larger than to scale for illustrational convenience. The refractive index alternates between each ridge 104 and slot 106, and their spatial frequency is chosen to reflect radiation emitted by detector elements 102 and create a photonic band gap.

In the detector array 100, the ridge/slot width in the plane of FIG. 5 may be chosen as $\lambda/4n$, where $\lambda$ is radiation wavelength and n is refractive index. If the refractive index n=4 for the ridges 104 and n=1 for the slots 106 and the centre wavelength in the photonic band gap is 5 $\mu$m, then the band gap extends from 3 to 7 $\mu$m. The photonic band gap is a function of angle of incidence, but the dependence is not strong and most of the radiation is inhibited from coupling between adjacent detector elements 102.

Figure 7:
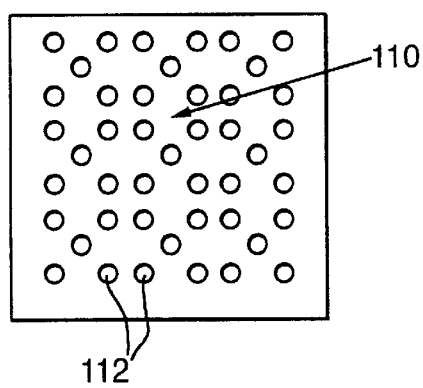
FIG. 7 is similar to FIG. 5 except that the photonic band gap structures are implemented by holes.

Alternatively, as shown in FIG. 7, each detector element 110 may have a two-dimensional array of holes such as 112 each parallel to the element thickness dimension; this inhibits radiation propagation to neighbouring elements in directions perpendicular to the thickness dimension. The array may be a square or hexagonal pattern. A third alternative, not illustrated, is a two dimensional array of holes replacing slots 104 and ridges 106 in the detector array 100 and extending parallel to its thickness dimension.

What is claimed is:

1. A photon noise reduced photon detector including an array comprised of a plurality of detector elements, said detector comprising:

a reflecting means, located between detector elements in said array, for isolating each element in said array from photons emitted by other elements of said array, and the detector elements of said array being arranged to exhibit negative luminescence and thereby reduced photon emission.

2. A photon detector according to claim 1 wherein each detector element is a semiconductor diode arranged to exhibit at least one of carrier exclusion and extraction under reverse bias to reduce an intrinsic contribution to carrier concentration in an active element region.

3. A photon detector according to claim 2 wherein each detector element comprises an active region exhibiting intrinsic conductivity when unbiased, minority carrier flow to the active region when biased is inhibited by the active region being sandwiched between two regions of wider bandgap.

4. A photon detector according to claim 1 wherein each detector element comprises an active region exhibiting extrinsic conductivity when unbiased, minority carrier flow to the active region when biased is inhibited by the active region being sandwiched between two regions of wider bandgap.

5. A photon detector according to claim 3 wherein the wider bandgap regions are of opposite conductivity type to one another.

6. A photon detector according to claim 5 wherein the active region and wider bandgap regions are in turn sandwiched between two further regions of wider bandgap than the active region, of higher doping than the other regions and of the same majority carrier type to respective adjacent regions.

7. A photon detector according to claim 1 wherein the reflecting means is a mirror which is arranged to reflect away from detector elements photons not received directly from a scene imaged thereon.

8. A photon detector according to claim 1 including a cold shield arranged to screen the detector elements from unwanted radiation.

9. A photon detector according to claim 1 wherein the reflecting means incorporates Winston cones arranged to concentrate radiation from an observed scene upon the detector elements and to screen them from unwanted radiation.

10. A photon detector according to claim 1 including a photonic band gap structure arranged to reduce radiation exchange between detector elements.

11. A photon detector according to claim 1 wherein the detector elements are diodes and the photon detector includes a bias source for applying a reverse bias voltage to detector elements to render them negatively luminescent and reduce their photon emission.

12. A photon detector according to claim 11 wherein the bias source voltage is greater than $kT/q\log(n^2)$, where k is Boltzmann's constant, T is absolute temperature, q is the charge on the electron and n is an actual or effective value for detector component refractive index, i.e., the actual refractive index for detector components having the same refractive index, and effective refractive index for detector components having differing refractive indices calculated for the combination of these or an approximation thereto if the indices are similar.

13. A photon detector according to claim 11 wherein detector elements incorporate CdHgTe layers with refractive index 3.8 and are arranged on a GaAs substrate with the bias source voltage greater than 70 mV.

* * * * *